United States Patent [19]

Haas et al.

[11] Patent Number: 4,786,858
[45] Date of Patent: Nov. 22, 1988

[54] LIQUID CRYSTAL ELECTROSTATIC VOLTMETER

[75] Inventors: Werner E. Haas, Webster; John R. Andrews, Fairport, both of N.Y.

[73] Assignee: Xerox Corporation, Stamford, Conn.

[21] Appl. No.: 943,236

[22] Filed: Dec. 18, 1986

[51] Int. Cl.$^4$ .................. G01R 23/16; G02F 1/03
[52] U.S. Cl. .................. 324/96; 324/73 R; 324/158 R; 350/356
[58] Field of Search .................. 324/72, 96, 457, 458, 324/109; 350/331 R, 346, 356, 374; 332/7.51; 355/14 CH, 3 CH; 340/661

[56] References Cited

U.S. PATENT DOCUMENTS

| | | | |
|---|---|---|---|
| 3,627,408 | 12/1971 | Fergason | 353/84 |
| 3,934,199 | 1/1976 | Channin | 324/158 R |
| 3,936,815 | 2/1976 | Kogure et al. | 350/346 X |
| 3,938,878 | 2/1976 | Fox | 350/356 X |
| 3,939,412 | 2/1976 | Hermstein et al. | 324/96 |
| 4,029,393 | 6/1977 | Dungan et al. | 350/331 R X |
| 4,100,484 | 7/1978 | Buchheit | 324/32 |
| 4,112,361 | 9/1978 | Nakada et al. | 324/92 |
| 4,277,146 | 7/1981 | Morgan et al. | 350/356 X |
| 4,279,474 | 7/1981 | Belgorod | 350/331 R |
| 4,396,997 | 8/1983 | Kahn et al. | 350/351 X |
| 4,423,927 | 1/1984 | Bly | 350/331 R |
| 4,446,425 | 5/1984 | Valdmanis et al. | 324/77 K |
| 4,465,969 | 8/1988 | Tada et al. | 324/96 X |
| 4,579,422 | 4/1986 | Simoni et al. | 350/331 R |
| 4,589,735 | 5/1986 | Saunders | 350/346 X |
| 4,643,525 | 2/1987 | Haim | 350/331 R X |

FOREIGN PATENT DOCUMENTS

| | | |
|---|---|---|
| 2724343 | 12/1978 | Fed. Rep. of Germany . |
| 2228234 | 11/1974 | France . |
| 0259975 | 12/1985 | Japan .................. 324/133 |
| 2179163 | 2/1987 | United Kingdom .................. 324/133 |
| 2049205 | 12/1988 | United Kingdom . |

OTHER PUBLICATIONS

Xerox Disclosure Journal, vol. 2, No. 6, Nov./Dec., 1977, p. 91 "Liquid Crystal Electrometer", R. Case.
Molecular Crystals and Liquid Crystals", A New Type of Analog Voltmeter Using Electrooptic Effect in Nematic Liquid Crystals", vol. 38, No. 4, 1977, pp. 303-309.
Review of Scientific Instruments, "Direct Reading DC Electro-Optic Voltmeter with High Input Resistance", K. Geisen et al., vol. 48, No. 7, Jul. 1977, pp. 790-792, American Institute of Physics, NY.
Proceedings of the Society for Information Display, "A Facsimile Printer Utilizing an Array of Liquid Crystal Cells", J. Tults, vol. 12, No. 4, Fourth Quarter 1971, pp. 199-203, Los Angeles, CA.

Primary Examiner—Reinhard J. Eisenzopf
Assistant Examiner—Vinh P. Nguyen
Attorney, Agent, or Firm—Mark Costello

[57] ABSTRACT

A voltage sensing device having a liquid crystal cell electrically connected to a charged surface and having a light transmissivity varying with applied voltage. A light source is directed through the liquid crystal cell, and a light detector, detects changes in the intensity of light directed through the cell and providing an output indicative of variations in voltage on the charged surface. Polarizers, which polarize light from the light source directed through the liquid crystal cell, and analyze light exiting the cell, convert electro-optically induced phase changes into intensity changes. A saturation level biasing voltage is periodically applied to the liquid crystal cell to set the cell to a reference level, clearing the cell of transient polarization effects. A second reference liquid crystal cell may be provided, electrically coupled to a reference voltage. Signals from the charged surface derived by the liquid crystal cell connected to the surface are compared with reference signals derived by the reference cell prior to output of the signal to eliminate a time-based drift component from the output.

14 Claims, 4 Drawing Sheets

LIQUID CRYSTAL ELECTROSTATIC VOLTMETER

The present invention pertains generally to arrangements for sensing voltage, and more particularly to a non-contacting electrostatic voltage sensor for sensing voltage on a charged surface.

BACKGROUND OF THE INVENTION

Real time process control of electrophotographic devices is a desirable goal in the improvement of operation quality. One important parameter to be controlled is charging characteristics, and the levels of charge placed on the photoreceptor, or other surfaces to be charged in such devices. To control the levels of charge placed on these surfaces, it would be advantageous to continuously monitor the photoreceptor surface voltage, and adjust the charging system output continuously on the basis of the measured voltage. Differences in electrostatic forces are the motive force for toner development, and optimum control of the differences is the role of electrostatic voltmeters and control loops incorporating such measurement devices. Thus, for example, potential uses of an electrostatic voltmeter may be for voltage measurement and control of the photoreceptor charging by a corona charging device, measurement of dark decay between two points along the photoreceptor in the process direction, or measurement of the discharge potential from a standard test patch to set developer bias for optimum development. A real time voltage measurement system would desirably have a fast response time, a wide range of voltage measurement, accuracy and sensitivity within 1%, and relatively small size and be insusceptible to damage caused by high voltage electrical discharge. Such systems are also required to be relatively inexpensive, as high cost would mitigate against use of the device in smaller, lower cost devices.

In the past, the primary method of voltage sensing has been to provide a non-contacting capacitive pickup adjacent a charged surface in conjunction with a high impedance device to connect the pickup to signal processing circuitry which eventually will provide a signal to the control system of an electrophotographic device or to a desired display. It will be understood that a high impedance device is necessary to avoid discharge of the relatively high voltage on surfaces such as a photoreceptor into the sensor, which may affect operating characteristics of the reproduction device and the sensor.

Currently available electrostatic voltage sensing devices include primarily transistor amplifiers to amplify the signal from the pickup into a useful form for control purposes. These transistor amplifiers are highly susceptible to voltage breakdown. The environment about the photoreceptor is extremely hazardous to transistor use, since potentials of 1000 volts or more may be accidentally applied to the sensor through floating paper fibers, dust, etc., which would destroy the transistor circuitry.

Electro-optic materials provide variations in optical characteristics, depending on applied voltage. As demonstrated by U.S. Pat. No. 4,446,425 to Valdmanis et al., a traveling wave Pockels cell may be used to measure electrical signals applied thereto by noting variations in light passing through the Pockels cell. Pockels cells, comprising a lithium niobate or lithium tantalate, crystal provide satisfactory and detectable linear response to applied voltage, but required relatively high voltages to drive the electro-optic effect, are difficult to manufacture, as they require precise cutting in fabrication stages, and are somewhat sensitive to environment. Liquid crystal materials can provide a generally linear response to voltage changes applied to such materials. As described in U.S. Pat. No. 3,934,199 to Channin, optical changes in liquid crystals may be observed to be a function of voltage. Similarly, U.S. Pat. No. 3,627,408 to Fergason demonstrates applying an electric field to liquid crystals to produce an observable effect. U.S. Pat. No. 4,579,422 to Simoni et al teaches that the electro-optical response of liquid crystals subject to an applied voltage is very linear.

As described in Xerox Disclosure Journal Vol. 2, No. 6, November/December 1977 at page 91, variations in light transmissivity through liquid crystalline material may be used to determine changes in voltage on a charged surface. However, this disclosure fails to teach what electro-optic effects serve to provide satisfactory response times or a usable modulation mechanism which would impart voltage information onto a light beam transmitted therethrough. Because of their common usage in consumer technologies such as calculator, watch and television displays, the cost of liquid crystal materials is very low. Additionally, cells incorporating liquid crystals demonstrate relatively high impedance as seen by the photoreceptor, with relative insensitivity to instantaneous high voltage discharges therethrough.

U.S. Pat. No. 4,112,361 to Nakada et al. also shows a liquid crystal voltmeter comprising a nematic liquid crystal material providing a DAP effect sandwiched between polarizing filters and transparent electrodes. An analog voltmeter is provided by applying a voltage across the electrodes and noting variations in transmissivity of the liquid crystal cell.

SUMMARY OF THE INVENTION

It is accordingly a primary object of the invention to provide an electrostatic voltage sensor for use in sensing the voltage on a charged surface, which is highly sensitive to voltage variations, provides accurate voltage sensitivity over a wide range of values, has a relatively high impedance, resists voltage breakdown in harsh environments, and is inexpensive to manufacture.

It is another object of the invention to provide an electrostatic voltage sensor with the above characteristics including a liquid cyrstal cell in electrical contact with a charged surface, and an arrangement for detecting electro-optical changes in the cell to determine voltage of the surface.

It is yet another object of the invention to provide a method of operation of a liquid crystal voltmeter as defined above which avoids repetitious recalibration by compensating for drift.

In accordance with the invention, there is provided a voltage sensing device finding particularly advantageous use in sensing the voltage on a charged surface, comprising a liquid crystal cell electrically coupled to a charged surface and having a light transmissivity varying with applied voltage, a light source directed through the liquid crystal cell, and a light detector, detecting changes in the intensity of liquid directed through the cell and providing an output indicative of variations in voltage on the charged surface. Variations in the liquid crystal material characteristics are proportionally related to voltage applied thereto from the charged surface, so that the output of the sensor is proportional to the voltage applied to the cell. The liquid crystal cell may be capacitively coupled to the charged surface. A liquid crystal cell in the above described voltage sensing device may be advantageously comprised of a liquid crystalline material held between two glass plates. Exterior to each of the two glass plates, are polarizers which polarize light from the light source directed through the liquid crystal cell, and analyze light exiting the cell. Interior to each of the glass plates, a transparent conductor for electrical connection of the cell to the charged surface is provided as a coating on the glass plates. Voltage variations across the cell are evidenced by variations in the transmissivity of the cell, measured by the light source and detector combination. The amount of light detected may be used to form a signal indicative of voltage across the cell.

In accordance with another aspect of the invention a premeasurement biasing voltage may be applied to the liquid crystal cell to set the cell to a reference level, clearing the cell of transient polarization effects. While not clearly understood, measurement drift occurs over time, possibly as a result of ion implantation in an alignment layer used to induce alignment of the liquid crystals to produce a maximum measurable optical variations therein when exposed to a voltage. The measurement drift changes the voltage following characteristics of the liquid crystal cell. The change is related to the RC characteristics of the liquid crystal cell. A bias voltage is applied to the cell to increase the electro-optical response of the cell to a condition giving maximum response to voltage variations. In operation, the cell is removed from the bias voltage and electrically connected to the charged surface to sense voltage thereon. After a predetermined time, the cell is removed from connection with the charged surface for recharging to selected bias voltage. This time it is biased with a voltage equal to the first bias voltage, but opposite in polarity. Subsequent to charging, the cell is returned to electrical connection with the charged surface for operation. The bipolar charging is continued as the operation of the sensor proceeds. Bipolar charging of liquid crystalline material has been noted in the context of maintaining optimal response time in liquid cell devices such as spectacles having variable optical density, as shown in U.S. Pat. No. 4,279,474 to Belgorod.

In accordance with still another aspect of the present invention, a second reference liquid crystal cell is provided, electrically coupled to a reference voltage. Signals from the charged surface, derived by the liquid crystal cell connected to the surface, are compared with reference signals derived by the reference cell. In this manner, drift associated with continued operation of the voltage measuring device may be removed from the correction signal and continuous absolute calibration is maintained.

The advantage of the invention is that a very inexpensive arrangement can be provided, relatively insensitive to conditions inside an electrophotographic device, which has a high impedance as seen by the photoreceptor and is not susceptible to damage due to high voltage electrical discharge. The biasing arrangement described maintains the operation of the liquid crystal cell in a highly responsive voltage following condition. As the voltage following characteristics of the device decay over time, an arrangement is described which compensates for the decay.

These and other objects and advantages will become apparent as the following description is reviewed in conjunction with the accompanying drawings in which.

Figure 1:
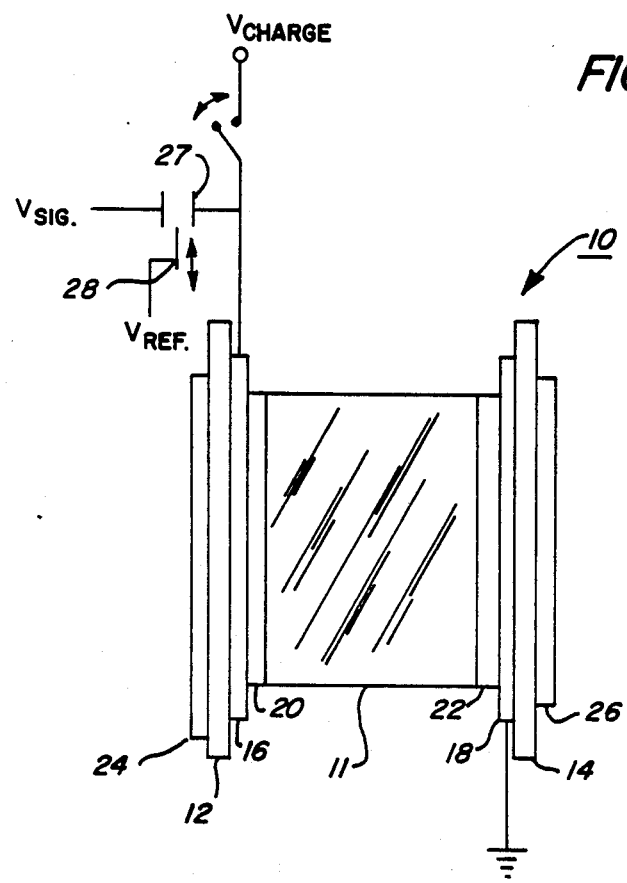
FIG. 1 is a somewhat schematic view of a liquid crystal cell, not to scale, having a configuration suitable for use with the present invention.

With reference now to the drawings, wherein the showings are for the purpose of describing the invention with respect to a preferred embodiment and not for limiting same, FIG. 1 shows a liquid crystal cell suitable for use in the present invention. Liquid crystal cell 10 is advantageously comprised of a liquid crystalline material 11 sandwiched between two glass plates 12 and 14. Transparent electrodes 16 and 18 for directing a voltage across the liquid crystal material may be provided on the inner surface of each of glass plates 12 and 14 with a coating of a transparent conductor, such as for example, indium-tin-oxide. On the interior sides of the conductors, i.e., the side adjacent the liquid crystal material, alignment layers 20 and 22 may be provided as a coating over the transparent electrodes. On the exterior of the glass plates or substrates, i.e., the sides of the plates removed from the liquid crystal material, optically polarizing layers 24 and 26 may be comprised of polarizing plates or a polarizing coating on glass plates 12 and 14. The polarizing layers are provided to convert the electro-optically induced phase changes in light passing through the cell into intensity changes. In a preferred embodiment of the invention, the liquid crystalline material of the cell may be a variety of different materials, but generally, satisfactory materials have twisted nematic or cholesteric nematic, or smectic phase transition, or a deformation of aligned phase (DAP) effect. These effects have been chosen as having a relatively fast response time to voltage variations across the cell. Other observable effects, such as simple scattering effects, may be used, although voltage response times may be slowed. A high impedance is also desirable, with satisfactory materials having resistivity in the range of $10^{10}$ to $10^{14} \Omega$. Capacitance of a satisfactory cell may be about 50 pf.

Electrode 18 of the liquid crystal cell is connected to a reference voltage or ground. Electrode 16 is connected via a capacitive pickup 27 to a signal voltage to be measured, $V_{sig}$, such as the surface of a photoreceptor in an electrophotographic device. $V_{sig}$ may be removed from connection with the liquid crystal cell 10 by providing a mechanically driven shutter 28 which is controllably driven between a position allowing electrical coupling of the capacitive pickup and $V_{sig}$, and a position blocking such electrical coupling. The shutter is held at reference voltage or ground $V_{ref}$. In the blocked condition, the capacitive pickup derives only the signal $V_{ref}$ on the shutter. Electrode 16 is also directly connectable to another voltage source, $V_{charge}$, for charging the the liquid crystal cell to a biasing voltage, as will be further explained hereinbelow. While the described embodiment provides a pickup having a capacitive couple to the charged surface, a resistive couple, switchable between connection with the photoreceptor and the reference voltage, is also within the scope of the invention.

Figure 2:
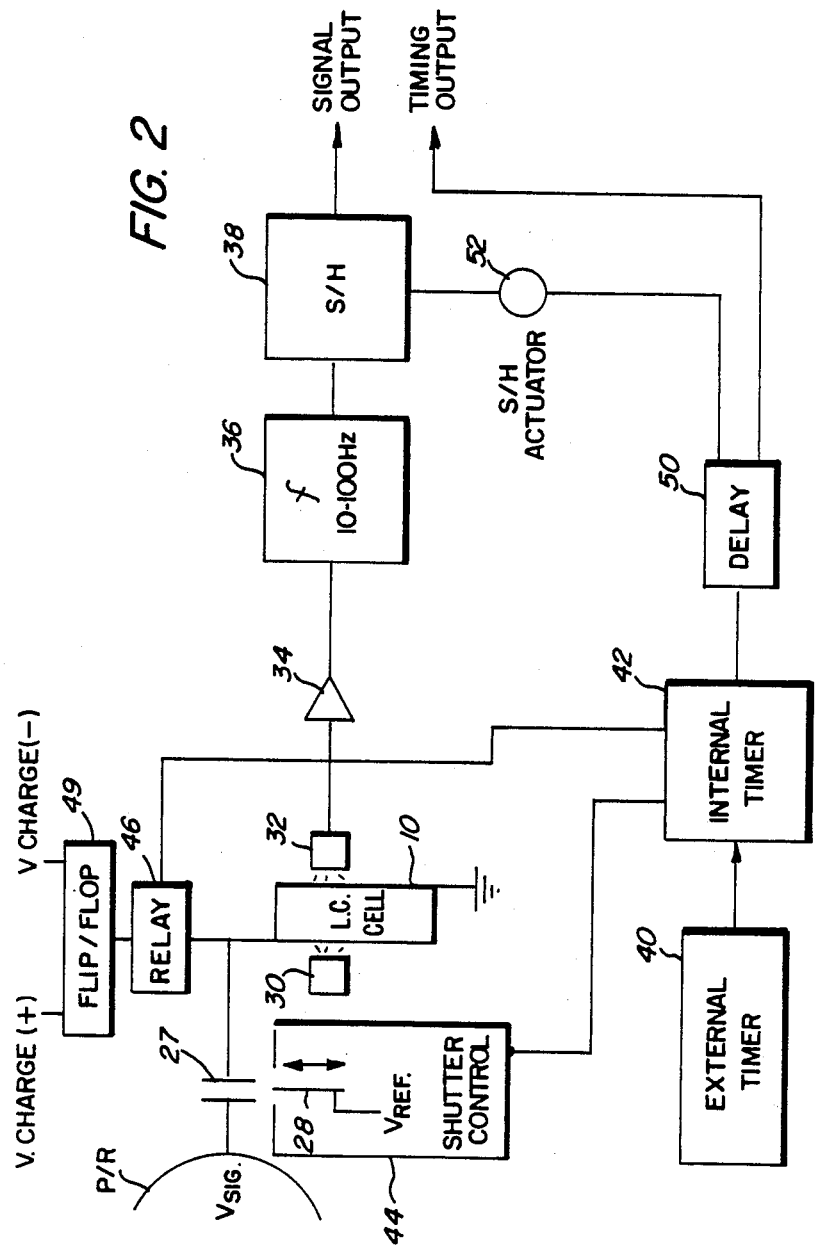
FIG. 2 is a schematic diagram of a circuit incorporating the present invention.

FIG. 2 demonstrates a preferred circuit contemplated for use in the invention. Light source 30, such as a light emitting diode (LED) or a small light bulb is arranged to direct light through the layers of liquid crystal cell 10. A light detector 32, such as, for example, a phototransistor or LDR, is provided on an opposite side of the liquid crystal cell, detecting light directed therethrough. Varying voltage on the photoreceptor causes variations in the light transmitting characteristics of the liquid crystal cell 10. These characteristics vary the intensity of the light directed through the liquid crystal cell.

Detector 32 produces an output signal based on the intensity of the detected light, and directs a signal indicative of the intensity of detected light to an amplifier 34, which amplifies the signal appropriately for use by output device, such as an electrostatic voltmeter, or control loops in electrophotographic devices. A band pass filter 36 is optionally provided for the purpose of isolating the signal within a selected relatively low frequency range (e.g., 10-100 Hz) to eliminate slowly varying transmissions through the liquid crystal cell 10 caused by leakage currents. The signal is periodically sampled by a sample and hold circuit 38 which holds a peak value of the signal for an output. The output from sample and hold circuit 38 provides an analog signal proportional to $V_{sig}$ for use by the output device. In alternative embodiments, the output may be provided by an integrator measuring the signal from the light detector or amplifier over time, or by providing direct digitizing of the signal from the the light detector or amplifier.

In accordance with the invention, liquid crystal cell 10 is provided with an arrangement for the avoidance of measurement drift caused by changes in the voltage response characteristics of the liquid crystal cell over time. An external timing source 40, preferably from an electrophotographic device control system, directs periodic timing signals to an internal timing device 42 for controlling operation of the described voltage sensing device. In accordance with the receipt of a timing signal from the external timing source, internal timing device 42 provides a signal to shutter control 44 to periodically close shutter 28. The closing of shutter 28 isolates liquid crystal cell 10 from $V_{sig}$ and couples the cell with $V_{ref}$. At the same time, relay 46 is enabled by internal timing device 42 to connect $V_{charge}$ to liquid crystal cell 10. Flip/flop switch 49 or other switching arrangement is used to alternately connect either polarity of $V_{charge}$ to the cell through relay 46 as required, and in accordance with the charging scheme of FIG. 3.

Figure 3:
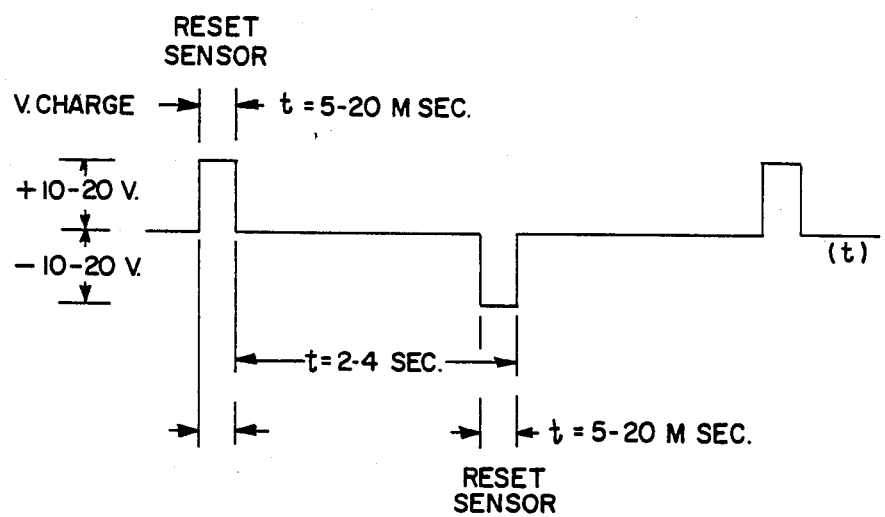
FIG. 3 is a voltage waveform diagram showing a voltage waveform suitable for use in one aspect of the invention.

As shown in FIG. 3, $V_{charge}$ applied to cell 10 may be a bipolar, periodic pulse applied to the liquid crystal cell to recharge to liquid crystal cell. The pulse applied may be relatively short in time, desirably in the range about 5-20 msec, and have a magnitude of about 10-20 volts. In one working embodiment, a pulse width of about 13 msec and a pulse magnitude of 14.8 volts was found advantageous. Signals within the defined range have been found satisfactory with respect to the liquid crystal cells used, because the liquid crystal cell is satisfactorily charged to the selected bias level voltage in a relatively short period. The biasing voltage level is chosen to place the liquid crystal cell in a condition in which the change in optical transmission qualities with the voltage applied from the charged surface is relatively large. In one embodiment, this value was approximately equal to the saturation voltage of the liquid crystal cell. A wide range of other voltage pulse magnitudes and widths may be useful, which drive selected liquid crystal cells to a biased condition in a reasonable period of time. The pulse may be repeated regularly over a wide choice of time intervals and in a preferred embodiment, it was found that a pulse every 2-4 sec. satisfactorily maintained the voltage following characteristics of the liquid crystal cell with the above described bipolar voltage pulse signal. The application of the voltage across the liquid crystal cell is believed to have the effect of driving the liquid crystalline material into a polarized condition. Over time, the RC characteristics of the liquid crystal cell result in a relaxation and gradual depolarization of the crystals in the cell. The result is a gradual loss of sensitivity in voltage measurement. For a cell having a resistivity in the range of $10^{13}$ ohm-cm., and a cell capacitance of about 50 pf, an RC relaxation time of about 6 sec. is expected. The interval for applying the pulses defined in the preferred embodiment allows recharging the liquid crystal cell before significant relaxation effects measurement parameters. Other significantly shorter or longer intervals are well within the scope of the invention, however, as are a wide range of pulse magnitudes and pulses widths.

With reference again to FIG. 2, internal timing device 42 also directs a timing signal to sample and hold circuit 38, through a time delay circuit 50 to control the sample and hold circuit by providing a signal to a sample and hold circuit reset and actuate device 52. Thus, in accordance with the periodic charging of the liquid crystal cell 10 to voltage following biased condition, sample and hold circuit 38 is reset and actuated to begin derivation of a new output voltage signal.

Figure 4:
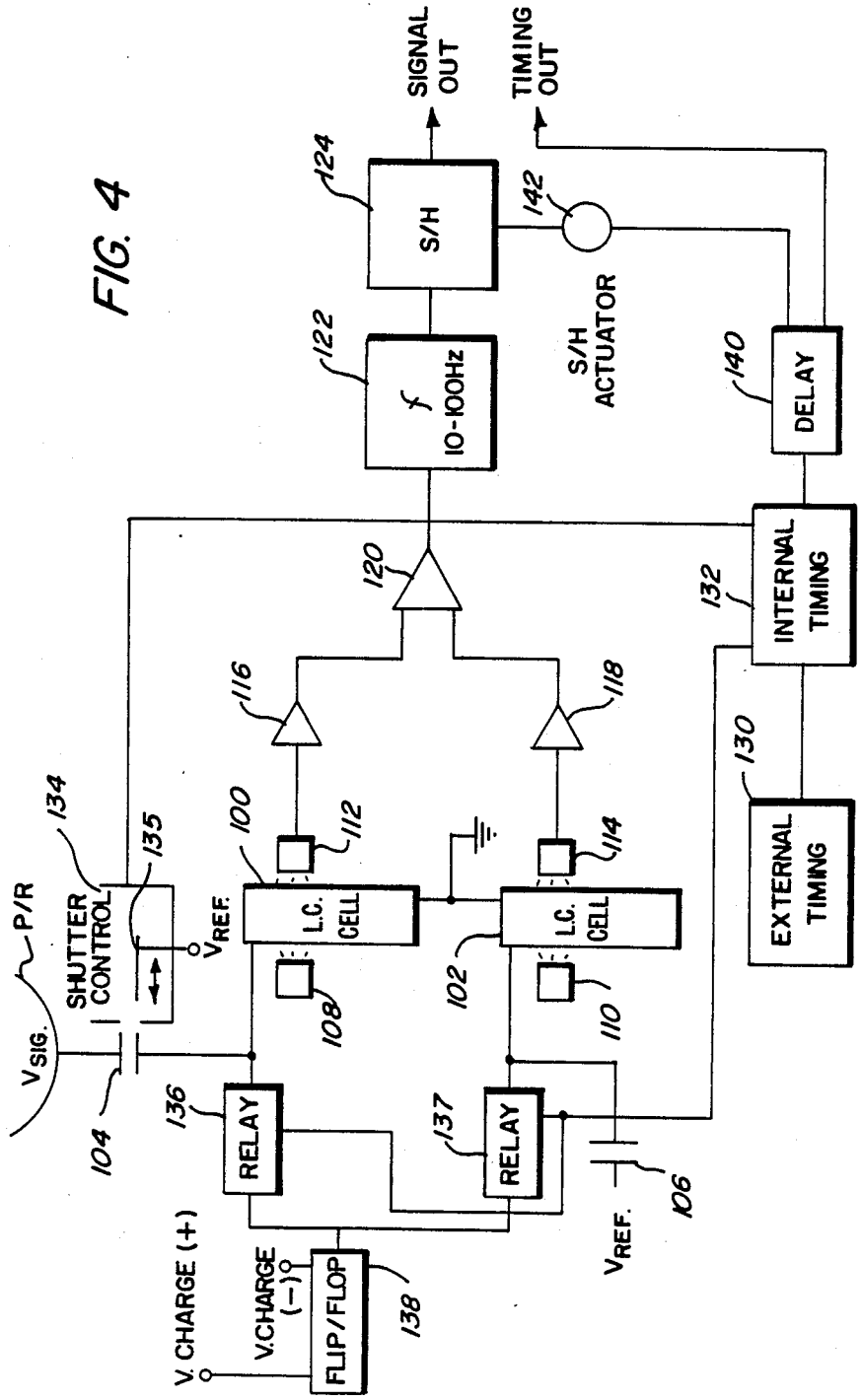
FIG. 4 is a schematic diagram of another circuit incorporating another aspect of the present invention.

In accordance with another aspect of the invention, a two cell sensor arrangement is provided to allow comparison of measured values with known reference values to allow subtraction of the drift associated with the RC relaxation of the liquid crystal cell. With reference to FIG. 4, two liquid crystal cells 100 and 102 are provided. First liquid crystal cell 100 is electrically connected to via a capacitive couple 104 to a signal source $V_{sig}$ similar to the arrangement provided in the previously described single cell embodiment. The second cell 102, similarly comprised, is electrically connected coupled via capacitive couple 106 to the reference voltage $V_{ref}$. Thus, variation in the transmissivity of the second cell varies only in accordance with the changes in the liquid crystal cell characteristics, and not in response to a changing voltage signal. In the preferred embodiment, the liquid crystal cells are matched as closely as possible for resistivity and capacitance so that similar RC relaxation periods are derived.

Operation of the liquid crystal cells is similar to the operation of the previously described embodiment. Light is directed through each cell 100 and 102 by light sources 108 and 110. The intensity of the light passing through the liquid crystal cells is detected by light detectors 112 and 114. Signals derived by each of the detectors 112 and 114 as a result of detecting light passing through the liquid crystal cell is passed through amplifiers 116 and 118 to change the signal into a form suitable for selected output devices. The signals are compared at a differential amplifier 120, which subtracts the component of the signal derived from $V_{ref}$ from $V_{sig}$, as the $V_{ref}$ component of the signal is common to $V_{sig}$ and caused by inherent variations in the characteristics of the liquid crystal cell. The signal seen at the output of differential amplifier 120 is handled in the same manner as for the single cell case. The signal is optionally filtered by bandpass filter 122, and a peak value is detected and held at the sample hold circuit 124 to be passed to an output. As previously described, alternative embodiments of the present invention could provide for digitizing the output signal from the light detector.

With continued reference to FIG. 4, the double cell case requires charging both liquid crystal cells 100 and 102 to the biased condition to maintain the voltage following characteristics of the device. Signals from an external timing source 130 drive internal timing source 132. Internal timing source 132 drives shutter control 134 to close shutter 135, isolating liquid crystal cell 100 from $V_{sig}$ and coupling the cell to $V_{ref}$. At the same time, relays 136 and 137 are enabled to connect $V_{charge}$ to liquid crystal cells 100 and 102, respectively. Flip-flop switch 138 alternately allows connection of either polarity of $V_{charge}$ to the cells through relays 136 and 137 as required, and in accordance with the charging scheme of FIG. 3. Internal timing source 132 also drives, through time delay 140, actuation and resetting of sample and hold circuit 124, with sample and hold activator device 142. The internal timing signals, as modified by time delay 140, are directed to output devices as another part of the output signal.

The invention has been described with reference to a preferred embodiment. Obviously, modifications will occur to others upon reading and understanding the specification taken together with the drawings. The described embodiments are only examples, and various alternatives, modifications, variations or improvements may be made by those skilled in the art from this teaching which are intended to be encompassed by the following claims.

We claim:

1. A voltage sensor for sensing voltage on a charged surface, comprising:
    first and second liquid crystal cells, said liquid crystal cells including a high impedance electro-optically responsive material;
    said first liquid crystal cell electrically connected to a charged surface having a voltage to be measured;
    said second liquid crystal cell electrically connected to a reference voltage;
    said first and second liquid crystal cells each provided with a light source for directing light through said liquid crystal cell, and a light detector or detecting light passed through each said liquid crystal cell and providing a detector output signal indicative of detected light intensity; and
    comparison means for comparing said detector output signals from each of said light detectors, and providing a comparison signal indicative thereof as an corrected output signal representative of voltage on said charged surface.

2. A voltage sensor for sensing the voltage on a charged surface, said voltage sensor comprising:
    a pickup electrically coupled to a charged surface;
    a liquid crystal cell, electrically connected to said pickup and having a varying electro-optical response to signals therefrom;
    a light source directing light through said liquid crystal cell;
    a light detector detecting the intensity of light passed through said liquid crystal cell and providing an output indicative thereof, whereby electro-optically induced changes in said light passed through said liquid crystal cell are detected, representative of the voltage on said charged surface; and
    charging means for controllably directing a series of voltage pulses to said liquid crystal cell to periodically charge said liquid crystal cell to a selected bias condition.

3. The voltage sensor as defined in claim 2 wherein said voltage pulses comprise a series of a pulses having alternating polarity.

4. The voltage sensor as described in claim 3 wherein the width of said pulses is in the range of 5-20 milliseconds.

5. The voltage sensor as described in claim 3 wherein said series of voltage pulses comprises a pulse train of bipolar pulses having intervals in the range of about 2-4 seconds.

6. The voltage sensor as defined in claim 2 wherein said voltage pulses have a magnitude in the range of about 10-20 volts.

7. A voltage sensor for sensing voltage on a charged surface, comprising:
    first and second liquid crystal cells, said liquid crystal cells comprising a high impedance electro-optic material;
    said first liquid crystal cell electrically connected to a charged surface having a voltage to be measured;
    said second liquid crystal cell electrically connected to a reference voltage;
    said first and second liquid crystal cells each provided with a light source for directing light through said liquid crystal cell, and a light detector for detecting light passed through said liquid crystal cell and providing a detector output signal indicative of detected light intensity;
    comparison means for comparing said detector output signals from each said light detector, and providing a comparison signal representative thereof as a corrected output signal; and
    charging means for controllably directing a series of voltage pulses to said liquid crystal cells to periodically charge said liquid crystal cells to a selected bias condition.

8. The voltage sensor as defined in claim 7 wherein said voltage pulses comprise a series of pulses having alternating polarity.

9. The voltage sensor as described in claim 8 wherein the width of said voltage pulses is in the range of 5-20 milliseconds.

10. The voltage sensor as described in claim 7 wherein said series of voltage pulses comprises a pulse train of bipolar pulses having pulse of intervals in the range of about 2-4 seconds.

11. The voltage sensor as defined in claim 7 wherein said voltage pulses have a magnitude in the range of about 10-20 volts.

12. A method of operating a voltage sensor for sensing a voltage on a charged surface, said voltage sensor including a pickup electrically coupled to a charged surface in an electrophotographic device; high impedance electro-optic material electrically coupled to said pickup capacitor, whereby a voltage is created across said electro-optic material proportional to the voltage on said charged surface and causing electro-optical changes in said electro-optic material; a light source directing light through said electro-optic material; and light detecting means for detecting the intensity of light passed through said electro-optic material and generating a proportional signal therefrom, said method comprising the steps of:

(a) removing said pickup from electrical coupling with said charged surface and applying a reference voltage to said pickup;
(b) biasing said electro-optic material to a predetermined voltage level of a selected polarity;
(c) removing said bias voltage from said electro-optic material and removing said reference voltage from said pick-up;
(d) coupling said pickup to said charged surface;
(e) sampling transmissivity of the electro-optic material for a selected period;
(f) removing said pickup from electrical coupling with said charged surface and applying a reference voltage to said pickup;
(g) biasing said electro-optic material to a predetermined voltage level of an opposite polarity;
(h) removing said bias voltage from said high impedance electro-optic material and removing said reference voltage from said pickup;
(i) coupling said pickup to said charged surface;
(j) sampling transmissivity of the electro-optic material for a selected period;
(k) repeating steps (a)-(j).

13. A method of operating a voltage sensor for sensing a voltage on a charged surface in an electrophotographic device, said voltage sensor including a pickup electrically coupled to a charged surface in an electrophotographic device; and electrically connected to a liquid crystal cell, whereby a voltage is created across said cell proportional to the voltage on said charged surface causing transmissivity variations in said liquid crystal cell; a light source directing light through said liquid crystal cell; and a light detector for detecting the intensity of light passed through said liquid crystal cell and generating a proportional signal therefrom, said method comprising the steps of:
(a) removing said pickup from electrical coupling with said charged surface and applying a reference voltage to said pickup;
(b) biasing said liquid crystal cell to a predetermined voltage level of a selected polarity;
(c) removing said bias voltage from said liquid crystal cell and removing said reference voltage from said pickup;
(d) coupling said pickup to said charged surface;
(e) sampling transmissivity of the liquid crystal cell for a selected period;
(f) removing said pickup from electrical coupling with said charged surface and applying said reference voltage to said pickup;
(g) biasing said liquid crystal cell to said predetermined voltage level of an opposite polarity;
(h) removing said bias voltage from said liquid crystal cell and removing said reference voltage from said pickup;
(i) coupling said pickup to said charged surface;
(j) sampling transmissivity of the liquid crystal cell for a selected period;
(k) repeating steps (a)-(j) during operation of the electrophotographic device.

14. A method of operating a voltage sensor for sensing a voltage on a charged surface, said voltage sensor including a pickup electrically coupled to a charged surface; a first liquid crystal cell electrically coupled to said pickup, whereby a voltage is created across said liquid crystal cell proportional to the voltage on said charged surface causing electro-optical changes in said liquid crystal cell; a second liquid crystal cell electrically coupled to a reference voltage; each liquid crystal cell having a light source directing light through said cell for detection by a light detector which generates a proportional signal therefrom said method comprising the steps of:
(a) removing said pickup from electrical coupling with said charged surface and applying said reference voltage to said pickup;
(b) biasing said liquid crystal cells to a predetermined voltage level of a selected polarity;
(c) removing said bias voltage from said liquid crystal cells and removing said reference voltage from said pickup;
(d) coupling said pickup to said charged surface;
(e) sampling transmissivity of the liquid crystal cells for a selected period;
(f) comparing the outputs of each light detector to derive a corrected output signal;
(g) removing said pickup from electrical coupling with said charged surface and applying said reference voltage to said pickup;
(h) biasing said liquid crystal cells to a predetermined voltage level of an opposite polarity;
(i) removing said bias voltage from liquid crystal cells and removing said reference voltage from said pickup;
(j) coupling said pickup to said charged surface;
(k) sampling transmissivity of the liquid crystal cells for a selected period;
(l) comparing the outputs of each light detector to derive a corrected output signal;
(m) repeating steps (a)-(l) during operation of the electrophotographic device.

* * * * *